(12) United States Patent
Guo

(10) Patent No.: US 6,380,045 B1
(45) Date of Patent: Apr. 30, 2002

(54) METHOD OF FORMING ASYMMETRIC WELLS FOR DRAM CELLS

(75) Inventor: Jyh-Chyum Guo, Hsinchu Hsien (TW)

(73) Assignee: Vanguard International Semiconductor Corp., Hsinchu (TW)

( * ) Notice: Subject to any disclaimer, the term of this patent is extended or adjusted under 35 U.S.C. 154(b) by 52 days.

(21) Appl. No.: 09/591,454

(22) Filed: Jun. 12, 2000

(30) Foreign Application Priority Data

Mar. 24, 2000 (TW) ............................................. 89105428

(51) Int. Cl.⁷ ............................................. H01L 21/20

(52) U.S. Cl. ..................... 438/396; 438/238; 438/239; 438/253; 438/381; 257/298; 257/306

(58) Field of Search .................. 438/238, 239, 438/253, 396, 381, 255, 256; 257/296, 306, 311, 303, 298, 905

(56) References Cited

U.S. PATENT DOCUMENTS

| | | | | |
|---|---|---|---|---|
| 5,712,201 A | * | 1/1998 | Lee et al. | 438/239 |
| 5,744,387 A | * | 4/1998 | Tseng | 438/253 |
| 6,087,690 A | * | 7/2000 | Chi | 257/296 |

* cited by examiner

Primary Examiner—Charles Bowers
Assistant Examiner—Hsien-Ming Lee

(57) ABSTRACT

A fabrication method for forming asymmetric wells of a DRAM cell, and more particularly to a fabrication method for producing a transistor that is capable of reducing body effect, gate-swing and junction leakage current so as to enhance the reliability of a DRAM device. After doped regions used for source/drain are formed in a substrate, a local well and an anti-punchthrough pocket are then formed under the doped region to be used as drains in order to prevent short channel effect. Because the local well and the anti-punchthrough pocket do not extend to the doped region that is used as a source, the DRAM cell's ability for charge retention therefore can be kept at the same time.

12 Claims, 5 Drawing Sheets

METHOD OF FORMING ASYMMETRIC WELLS FOR DRAM CELLS

BACKGROUND OF THE INVENTION

1. Field of the Invention:

The present invention relates to a fabrication method for forming asymmetric wells of a DRAM cell, and more particularly to a fabrication method for producing a transistor that is capable of reducing body effect, gate-swing and junction leakage current so as to enhance the reliability of a DRAM device.

2. Description of the Prior Art:

As the function of a microprocessor is becoming more and more powerful and the operation scale of computer programs is becoming larger and larger, the demand for increasing the memory capacity of a memory storage device grows substantially. In order to fabricate low-cost memory devices with high memory capacity, DRAM technology becomes the leading-edge driver to push the semiconductor manufacturing technology to a higher level of integration. Attributed to 1T1C (1-Transistor, 1-Capacitor) structure adoped by DRAM cell higher integration level relative to other types of memory devices can be realized. The size of a transistor in a DRAM cell is therefore shrunk to increase the level of integration in a DRAM device. However, when the size is reduced to a sub-micron level, short channel effect, or SCE, can become very serious as a phenomenon of punchthrough can easily occur.

Referring to FIG. 1, it shows the cross-sectional view of a transistor used for solving the above-mentioned mentioned problems according to a conventional method. The method involves increasing the dosages of implants in a P well 102 and/or an anti-punchthrough region 104 formed in the entire active area of a silicon semiconductor substrate 100. A detailed description is as follows. A photoresist is formed over a silicon semiconductor substrate 100 by using a well mask before the N type transistors 106 of a DRAM device is formed. An ion implant process is then employed which uses the photoresist as an implant mask to form the P well 102 and the anti-punchthrough region 104 in sequence. Although the increases of the dosages of implants in the P well 102 and/or the anti-punchthrough region 104 can relieve the aforementioned short channel effect, it nevertheless leads to increases in the body effect, gate-swing, and junction leakage in a substrate 100, all of which are detrimental to DRAM cell's charge retention. Besides, the increase in body effect can degrade write-back efficiency, or less charges will be available for sensing. The increase in gate-swing can lead to the rise in $I_{off}$, which is a major cause for disturb failure. The increase in junction leakage can aggravate decay of the sensing signal during each refresh cycle.

Furthermore, scaling down the thickness of a gate oxide layer can be the most straightforward way to reduce body effect and gate-swing; however, the improvement will eventually saturate due to the limitations set by the finite thickness of an inversion layer. If the thickness of the gate oxide layer is overly scaled down, a tunneling current due to the Fowler-Nordheim effect or direct tunneling will occur. Fabricating DRAM devices on a SOI substrate is another way to minimize body effect and gate-swing without resort to scaling down the thickness of gate oxide layers. However, this new technology is not yet mature for practical use in DRAM production.

Therefore, it is an object of the present invention to provide a fabrication method for forming asymmetric wells of a DRAM cell in order to reduce the body effect, gate-swing, and junction leakage current found in a substrate so as to enhance DRAM cell's charge retention.

SUMMARY OF THE INVENTION

To achieve the above-mentioned objects, the method for forming asymmetric wells of a DRAM cell comprises: forming a gate structure on a substrate where a first well is formed thereupon; forming a first doped region and a second doped region on both sides of the gate structure in the first well to be used as a bit line contact region and a node contact region respectively; and then forming a second well below the bit line contact region, wherein the dopant concentration of the second well is higher than that of the first well.

According to an embodiment of the present invention, an anti-punchthrough pocket is formed below the first doped region in the second well after the second well is formed.

Inasmuch as the local second well and the local anti-punchthrough pocket do not expand to the node contact region, body effect, gate-swing, and junction leakage are reduced to improve DRAM cell's charge retention.

BRIEF DESCRIPTION OF THE DRAWINGS

The present invention will become more fully understood from the detailed description given herein below and the accompanying drawings, given by way of illustration only and thus not intended to be limitative of the present invention.

DETAILED DESCRIPTION OF THE INVENTION

Two doped regions, source and drain, of a transistor of DRAM cell are used as a bit line contact region and a node contact region respectively, wherein the reading or writing of data in a capacitor is operated by controlling the voltage between a gate electrode and the bit line contact region. During the process of writing binary data "0", the region nearby the bit line contact region has a stronger electric field. During the process of reading binary data "1", the region nearby the node contact region has a stronger electric field. With the continuous scaling of DRAM's transistors, the worse short channel effect (SCE) becomes a tough challenge to overcome. The present invention therefore provides a method for forming a local well and an anti-punchthrough pocket under the bit line contact region to prevent the above-mentioned short channel effect. At the same time, it can also maintain the charge retention time because the local well and the anti-punchthrough pocket keep away from the node contact region.

Figure 1:
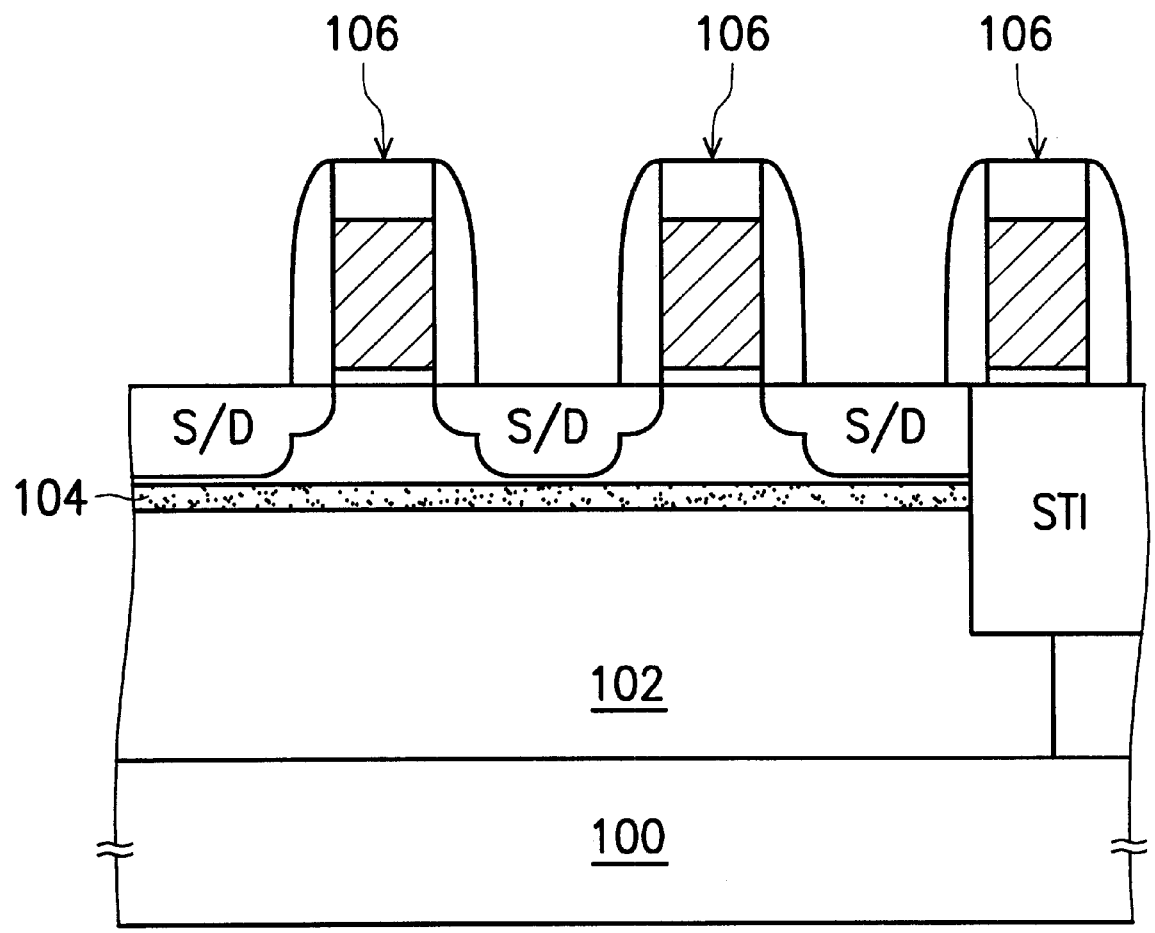
FIG. 1 shows a cross-sectional view of a transistor for a DRAM device according to a conventional method.
Figure 2A:
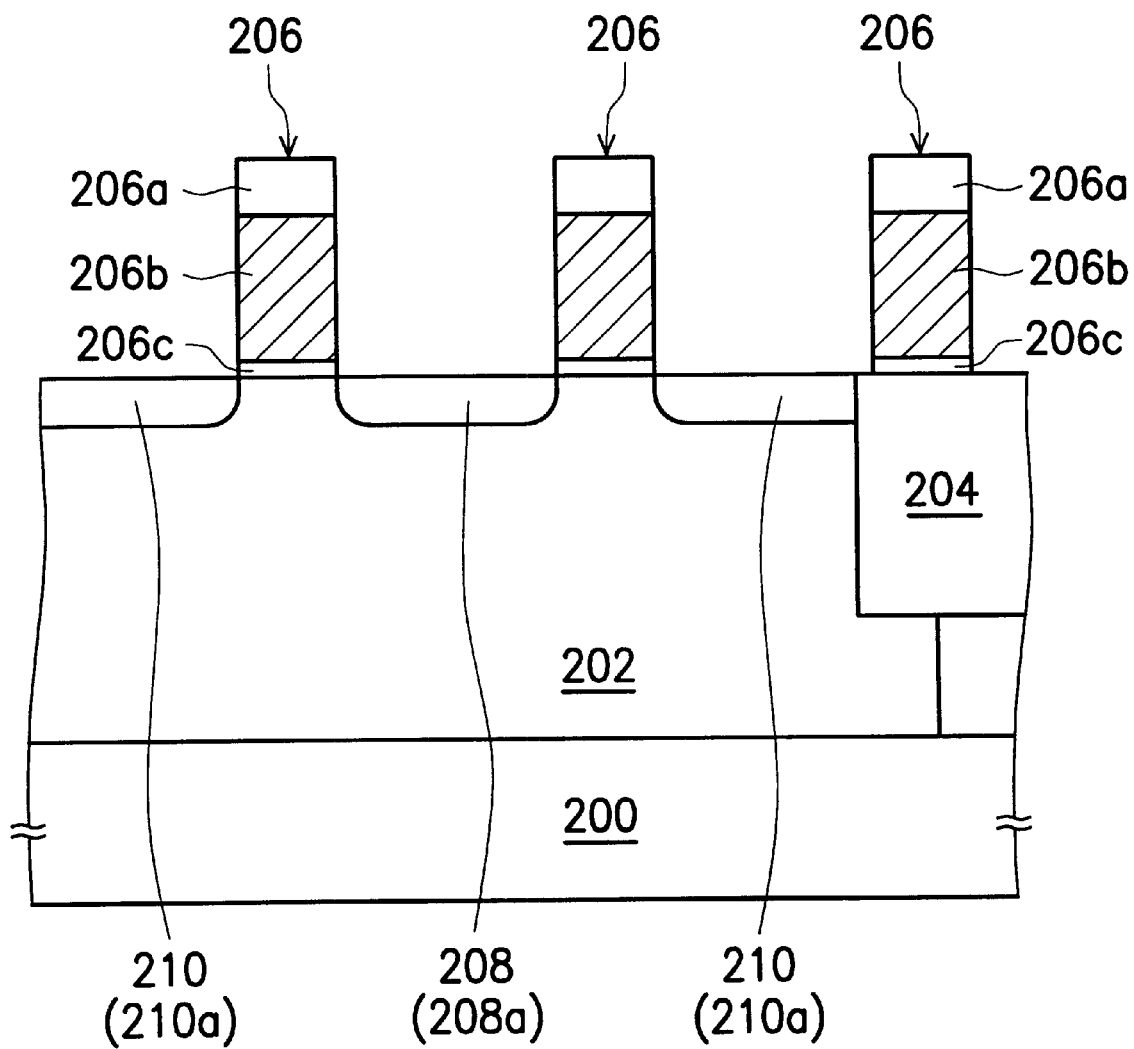
FIG. 2A through FIG. 2C show cross-sectional views of a DRAM cell with asymmetric wells at different fabricating stages according to an embodiment of the present invention.
Figure 2B:
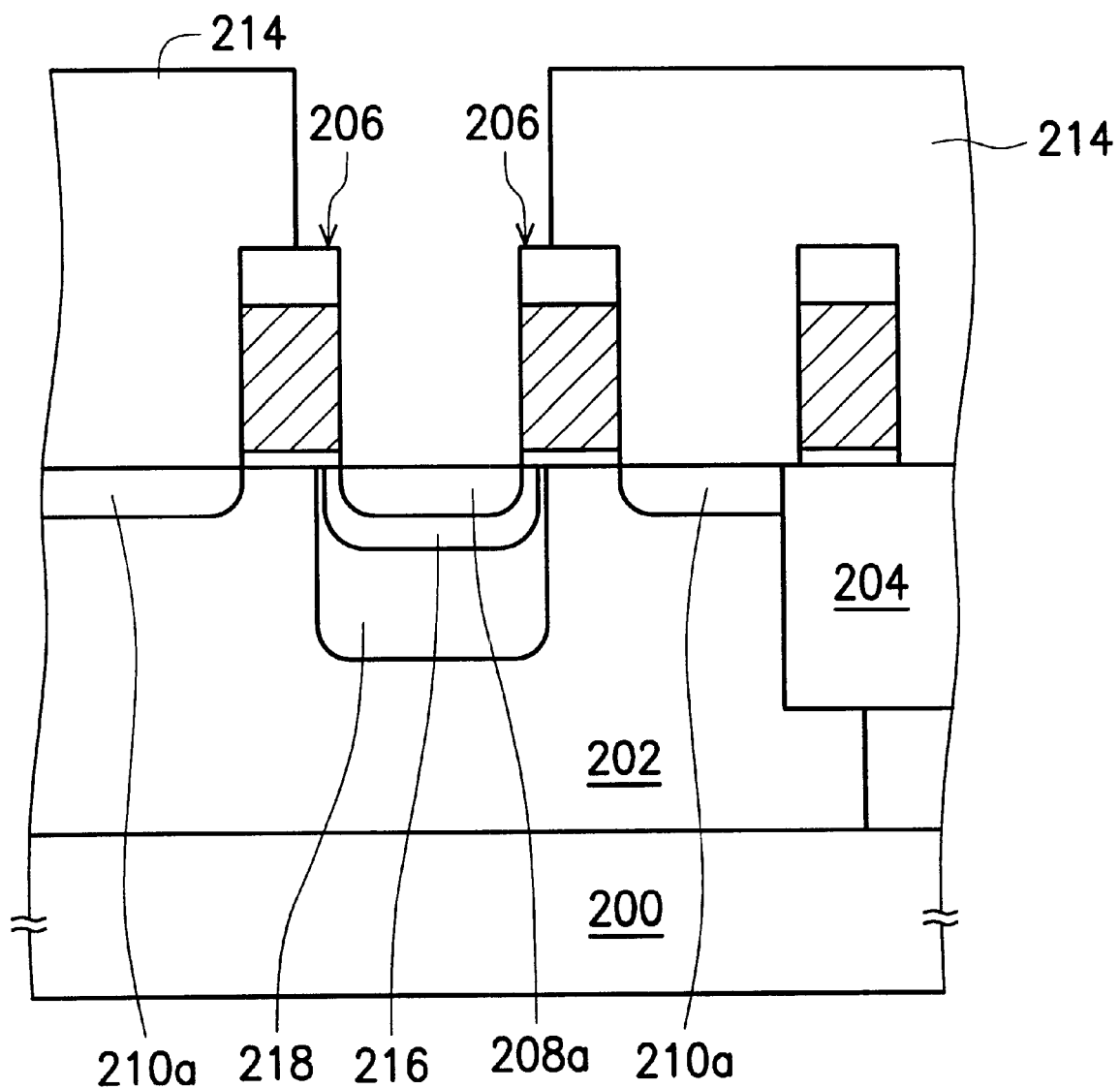
Figure 2C:
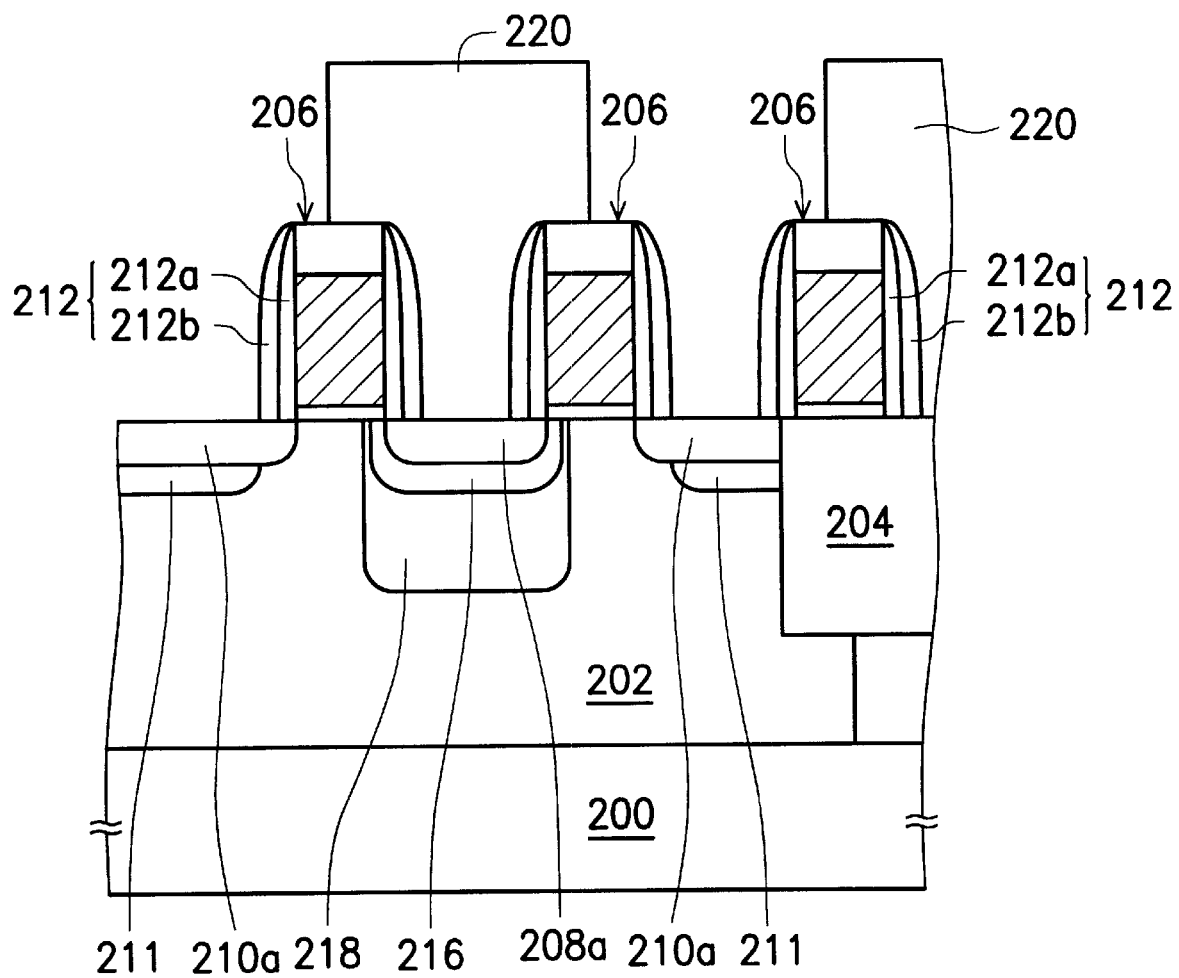

FIGS. 2A to 2C show cross-sectional views of the transistor with asymmetric wells for a DRAM cell at different fabricating stages according to an embodiment of the present invention.

Referring to FIG. 2A, a substrate 200, such as a silicon semiconductor substrate, is provided. A P well 202 is formed in the substrate 200 by an ion implant process, wherein the foremost step of the process is to form a mask layer (not shown) on the substate 200 as an implant mask layer. The ion implant process implants a high-energy/med-dose P type dopant, such as a $B^{11}$ dopant, with an energy of about 150 to 400 keV and a dosage of around $1\times10^{12}$ to $1\times10^{13}$ cm$^{-2}$ in the substrate 200. An isolation structure 204 of, for example, a shallow trench isolation structure is then formed in the substrate 200 to define an active region. A gate structure 206, such as the stacked layers comprised of a cap layer 206a, a gate-conducting layer 206b, and a gate oxide layer 206c is next to be formed on the substrate 200. Then doped regions 208 and 210 are formed in the P well 202 on opposite sides of the gate structure 206, wherein a bit line contact region 208a is located in the doped region 208 and a node contact region 210a is located in the doped region 210, respectively. The bit line contact region 208a is the part of the doped region 208 which is in electrical contact with a corresponding bit line contact formed afterwards. The node contact region 210a is the part of the doped region 210 which is in electrical contact with a corresponding node contact formed afterwards.

Referring to FIG. 2B, a mask layer 214 exposing the bit line contact region 208a is formed over the substrate 200. The mask used in the photolithography process to form the mask layer 214 is the same as that used to form the node contact. Therefore, extra new mask is saved to maintain process cost as low as possible. Specifically, an ion implant process implants a high-energy/med-dose P type dopant, such as a $B^{11}$ dopant, with an energy of about 150 to 400 keV and a dosage of about $1\times10^{12}$ to $1\times10^{13}$ cm$^{-2}$ in the substrate 200 for forming a local P well 218. The local P well 218 does not extend to the node contact region 210a.

Following the formation of the local P well 218, another ion implant process is employed using the same mask layer 214 to form an anti-punchthrough pocket 216 with a med-energy/med-dose P type dopant in the local P well 218, which is located under the bit line contact region 208a. For example, the dopant implanted can be a $B^{11}$ dopant with an energy of about 30 to 100 keV and a dosage of around $5\times10^{12}$ to $5\times10^{13}$ cm$^{-2}$.

Referring to FIG. 2C, after removing the mask layer 214, a spacer 212, such as a two-layer spacer composed of an oxide spacer 212a and a nitride spacer 212b, is formed on opposite sides of the gate structure 206. Another mask layer 220 exposing the node contact region 210a is formed over the substrate 200. An ion implant process is then employed that uses the mask layer 220 and the spacer 212 as an implant mask to form a self-aligning contact (SAC) region 211 under the node contact region 210a for further improving the charge retention time. The doped region 210 and the SAC region 211 are both used as a source. Finally, the mask layer 220 is removed.

Figure 3:
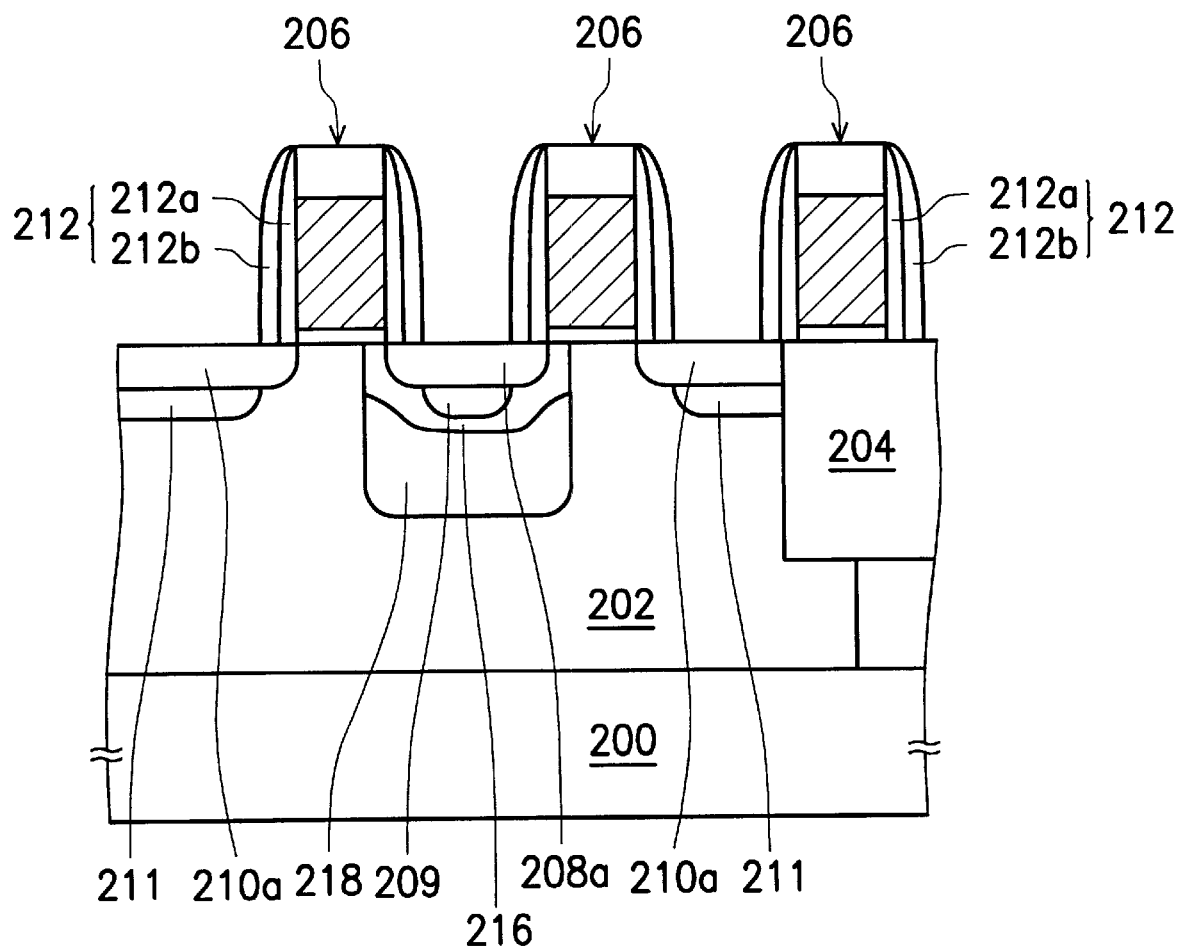
FIG. 3 shows a cross-sectional view of the DRAM cell with asymmetric wells according to another embodiment of the present invention.

The transistor according to the present invention has asymmetric sources (i.e. the doped region 210 and the SAC region 211) and drains (i.e. the doped region 208). Besides, the above-mentioned processes can be simplified to form a transistor with symmetric source/drain as shown in FIG. 3, whereas the method is illustrated as follows. After the spacer 212 is formed, the ion-implanting process is employed by using both the spacer 212 and the gate structure 206 as implant masks in order to form SAC regions 209 and 211 under the bit line contact region 208a and the node contact region 210a, respectively. The doped region 210 and the SAC region 211 are both used as a source, whereas the doped region 208 and the SAC region 209 are both used as a drain.

To conclude, this invention provides at least the following advantages:

1. This invention can reduce short channel effect by using local well and anti-punchthrough pocket under the bit line contact region.
2. The present invention can reduce body effect, gate-swing and junction leakage because the local well and the anti-punchthrough pocket do not extend to the node contact region. Therefore, charge retention time can be maintained to preserve the reliability of a DRAM device.
3. The mask used to form the local well and the anti-punchthrough pocket by photolithography is the same as that used to form the node contact. Therefore, no extra mask needs to be created, and the process cost is maintained as low as possible.
4. In forming an transistor with asymmetric sources/drains according to the present invention, the mask used to form the SAC region under the node contact region by photolithography is the same as that used to form the node contact. Therefore, only one mask needs to be created, and the cost is thus reduced.

The foregoing description of the preferred embodiments of this invention have been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method of forming asymmetric well for DRAM cell, comprising the steps of:
   providing a substrate having a first well;
   forming a gate structure on the first well;
   forming a first doped region and a second doped region on opposite sides of the gate structure to be used as a bit line contact region and a node contact region, respectively;
   forming a second well under the bit line contact region, wherein the doped concentration of the second well is higher than the first well and
   forming an anti-punchthrough pocket under the first doped region in the second well.

2. The method as claimed in claim 1, wherein the dopant of the anti-punchthrough pocket comprises a P type dopant.

3. The method as claimed in claim 1, wherein the forming method of the anti-punchthrough pocket compromises the step of proceeding an ion-implanting process to implant a dopant $B^{11}$ with a dosage of generally $5\times10^{12}$ cm$^{-2}$ to $5\times10^{13}$ cm$^{-2}$ and an energy of generally 30 keV to 100 keV.

4. The method as claimed in claim 1, wherein the forming method of the second well further comprises the step of proceeding an ion implant process to implant dopant $B^{11}$ with a dosage of $1\times10^{12}$ cm$^{-2}$ to $1\times10^{13}$ cm$^{-2}$ and an energy of 150 keV to 400 keV.

5. A method of forming asymmetric well for DRAM cell, comprising the steps of:
   providing a substrate having a first well;
   forming a gate structure on the first well;
   forming a first doped region and a second doped region on opposite sides of the gate structure, wherein a bit line contact region is disposed in the first doped region and a node contact region in the second doped region;

forming a mask layer over the gate structure, exposing the bit line contact region;

proceeding an ion implant process to form a second well under said bit line contact region, wherein the doped concentration of said second well is higher than the first well;

forming an anti-punchthrough pocket under the first doped region in the second well; and removing the mask layer.

6. The method as claimed in claim 5, wherein the dopant of the anti-punchthrough pocket comprises a P type dopant.

7. The method as claimed in claim 5, wherein the forming method of the anti-punchthrough pocket comprises the step of proceeding an ion-implanting process to implant a dopant $B^{11}$ with a dosage of generally $5 \times 10^{12}$ cm$^{-2}$ to $5 \times 10^{13}$ cm$^{-2}$ and an energy of generally 30 keV to 100 keV.

8. The method as claimed in claim 5, wherein the forming method of the second well further comprises the step of proceeding an ion-implanting process to implant a dopant $B^{11}$ with a dosage of $1 \times 10^{12}$ cm$^{-2}$ to $1 \times 10^{13}$ cm$^{-2}$ and an energy of 150 keV to 400 keV.

9. An asymmetric well for a DRAM cell comprising:

a substrate having a first well;

a gate structure formed on the first well;

a first doped region and a second doped region formed on opposite sides of the gate structure to be used as a bit line contact region and a node contact region, respectively;

a second well formed under the bit line contact region wherein the doped concentration of the second well is higher than the first well; and an anti-punchthrough pocket formed under the first doped region in the second well.

10. The asymmetric well of claim 9 wherein a dopant of the anti-punchthrough pocket comprises a P type dopant.

11. The asymmetric well of claim 9 further comprising a dopant $B^{11}$ with a dosage of generally $5 \times 10^{12}$ cm$^{-2}$ to $5 \times 10^{13}$ cm$^{-2}$ and an energy of generally 30 keV to 100 keV implanted in the anti-punchthrough pocket.

12. The asymmetric well of claim 9 further comprising a dopant $B^{11}$ with a dosage of generally $1 \times 10^{12}$ cm$^{-2}$ to $1 \times 10^{13}$ cm$^{-2}$ and an energy of generally 150 keV to 400 keV implanted in the anti-punchthrough pocket.

* * * * *